(12) United States Patent
Seto et al.

(10) Patent No.: US 6,427,320 B1
(45) Date of Patent: Aug. 6, 2002

(54) ELECTRONIC COMPONENT-MOUNTING APPARATUS AND COMPONENT-FEEDING DEVICE THEREFOR

(75) Inventors: Katsuyuki Seto, Gunma-ken; Kazuyoshi Oyama, Tochigi-ken; Yoshiharu Fukushima, Gunma-ken, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 117 days.

(21) Appl. No.: 09/675,879

(22) Filed: Sep. 29, 2000

Related U.S. Application Data

(62) Division of application No. 09/090,734, filed on Jun. 4, 1998, now Pat. No. 6,199,272.

(30) Foreign Application Priority Data

Jun. 5, 1997 (JP) .............................................. 9-163286
Jun. 17, 1997 (JP) .............................................. 9-176426

(51) Int. Cl.[7] .................................................. B23P 19/00
(52) U.S. Cl. .............................. 29/740; 29/741; 29/742; 29/739; 29/750
(58) Field of Search .......................... 29/740, 741, 743, 29/DIG. 44, 742, 759, 799, 703; 414/737, 752; 294/2, 64.1; 364/478.02

(56) References Cited

U.S. PATENT DOCUMENTS

| 5,032,053 A | * | 7/1991 | Krieg ........................... 414/278 |
| 5,102,291 A | * | 4/1992 | Hine ........................... 414/786 |
| 5,153,983 A | * | 10/1992 | Oyama ........................ 29/740 |
| 5,295,294 A | * | 3/1994 | Ito ............................... 29/740 |
| 5,727,311 A | * | 3/1998 | Ida et al. ...................... 29/832 |

* cited by examiner

Primary Examiner—Carl J. Arbes
Assistant Examiner—Sean Smith
(74) Attorney, Agent, or Firm—Darby & Darby

(57) ABSTRACT

A pallet-storing block of an electronic component-mounting apparatus stores a plurality of pallets each carrying thereon a tray containing a large number of electronic components. A desired pallet selected from the pallets is moved along a transfer path, in a manner such that the desired pallet is advanced to be introduced into a pickup area which extends to cover almost all of the transfer path or withdrawn from the pickup area into the pallet-storing block. Desired electronic components are sequentially picked up from the desired pallet introduced into the pickup area and mounted on a circuit board. The desired pallet is moved to a desired position within the pickup area.

7 Claims, 14 Drawing Sheets

F I G. 5
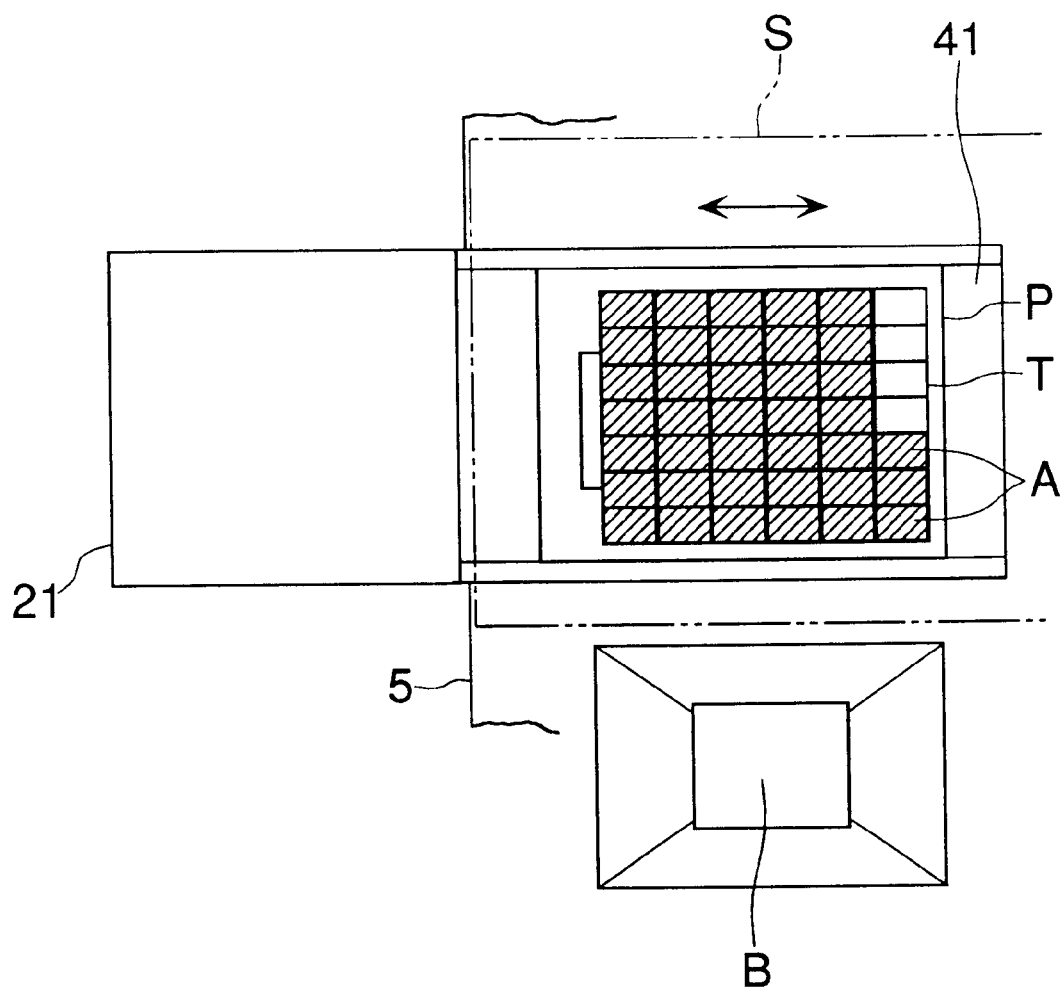

ELECTRONIC COMPONENT-MOUNTING APPARATUS AND COMPONENT-FEEDING DEVICE THEREFOR

RELATED APPLICATION

This is a division of application Ser. No. 09/090,734, filed Jun. 4, 1998, now U.S. Pat. No. 6,199,272 which has been allowed. The prior application is hereby incorporated herein by reference, in its entirety.

BACKGROUND OF THE INVENTION

1. Field of the Invention

This invention relates to an electronic component-mounting apparatus of a multi-function type for mounting electronic components supplied by using a pallet, on a circuit board.

2. Prior Art

Conventionally, an electronic component-mounting apparatus of this kind is known in which electronic components are directly fed to a main block thereof by bringing a pallet to a predetermined position in a pickup area of the main block, the pallet carrying thereon a single or a plurality of trays on which a lot of electronic components are juxtaposed (as disclosed e.g. in Japanese Laid-Open Patent Publication (Kokai) No. 3-257896). Such an electronic component-mounting apparatus includes an elevating mechanism for lifting and lowering pallets each carrying trays thereon to selectively guide the pallets to the level of a transfer path of the main block of the apparatus, a pallet guide device for drawing out the selected pallet from the elevating mechanism to the predetermined position in the pickup area along the transfer path, and a component-mounting device for picking up electronic components from the drawn-out pallet and mounting the same on a circuit board by using mounting heads thereof. Each pallet is lifted or lowered to the level of the transfer path by the elevating mechanism to be horizontally drawn out to the predetermined position in the pickup area by the pallet guide device.

The pallet guide device includes an engaging arm unit having an engaging arm rotatable to engage with a front edge of a pallet from above and a solenoid for actuating the engaging arm for engagement with and disengagement from the pallet, and a unit-moving device for moving the engaging arm unit forward and backward along the transfer path by using a motor as a drive source therefor. To draw out a pallet from the elevating mechanism, first the unit-moving device is driven to advance the engaging arm and the solenoid. When the engaging arm has reached the pallet, the engaging arm and the solenoid are stopped. Then, the solenoid is energized (or deenergized) to rotate the engaging arm to engage the same with the pallet. In this state, the engaging arm and the solenoid are moved backward to thereby draw out the pallet to the predetermined position in the pickup area. When a used pallet is returned to the elevating mechanism, the returning operation is carried out by completely reversing the above procedure.

The elevating mechanism and the pallet guide device are adjusted to operate at respective low speeds so as to prevent electronic components from leaving or jumping out of each component-holding groove in the tray. That is, each pallet is guided far more slowly than each mounting head carries out a sequence of operations required to pick up and mount an electronic component on the circuit board. When pallets are replaced, each mounting head has to wait until it is permitted to operate, resulting in an increase in tact time as a whole.

Further, in the case of the above-mentioned conventional electronic component-mounting apparatus, the pallet guide device is required to have two actuators (drive sources), i.e. a motor for the unit-moving device and a solenoid for the engaging arm unit, so that the conventional electronic component-mounting apparatus is complicated in construction. Moreover, the motor and the solenoid are driven in a manner interlocked with each other, which complicates the control of the apparatus.

SUMMARY OF THE INVENTION

It is a first object of the invention to provide an electronic component-mounting apparatus which is capable of minimizing a time period during which each mounting head has to wait to start operation.

It is a second object of the invention to provide a component-feeding device for an electronic component-mounting apparatus, which is capable of guiding a pallet to a pickup position by a simple construction and control system.

To attain the first object, according to a first aspect of the invention, there is provided an electronic component-mounting apparatus comprising:

a pallet-storing block for storing a plurality of pallets each carrying thereon a tray containing a large number of electronic components;

transfer means for moving a desired pallet selected from the pallets along a transfer path, in a manner such that the desired pallet is advanced to be introduced into a pickup area which extends to cover almost all of the transfer path or withdrawn from the pickup area toward the pallet-storing block;

component-mounting means for sequentially picking up desired electronic components from the desired pallet introduced into the pickup area and mounting the desired electronic components on a circuit board; and control means for controlling the transfer means in a manner such that at least part of the desired pallet is moved to a desired position in the pickup area.

According to this electronic component-mounting apparatus, the pickup area from which electronic components are picked up is expanded to substantially the whole area of the transfer path, whereby it is possible to pick up electronic components from a pallet introduced to or positioned at any location on the transfer path the pallet is guided. Further, a desired pallet drawn out from the pallet-storing block can be introduced to a desired position in the transfer path, which makes it possible to introduce the desired pallet to a suitable position in the above transfer path, while taking into account a speed at which the component-mounting means carries out its electronic component-pickup and mounting operations such that the electronic component-mounting means does not have to wait for the desired pallet to be brought to a proper or predetermined position.

Preferably, the component-mounting means includes a mounting head, the mounting head sequentially picking up and mounting the desired electronic components on the circuit board.

According to this electronic component-mounting apparatus, a desired pallet drawn out from the pallet storing block can be introduced to a desired position in the transfer path, which makes it possible to introduce the desired pallet to a suitable position in the above passage, while taking into account a speed at which the mounting head carries out its electronic component-pickup and mounting operations such that the mounting head does not have to wait for the desired pallet to be brought to a proper or predetermined position.

More preferably, the electronic components are juxtaposed within the tray in a plurality of rows, the control means controlling the transfer means in a manner such that the desired pallet is stepwise advanced to thereby sequentially introduce each of the rows into the pickup area, the mounting head picking up desired electronic components from the each of the rows, as the each of the rows is sequentially brought into the pickup area.

According to this preferred embodiment, electronic components carried on a pallet can be sequentially picked up as each of rows of electronic components is sequentially brought into the pickup area, whereby it is possible to reduce the traveling distance of each pallet. Although this increases the traveling distance of the mounting head, the mounting head travels much faster than the pallet and hence it is possible to reduce the tact time (mounting time per circuit board) as a whole.

Alternatively, the control means controls the transfer means in a manner such that the desired pallet is advanced along the transfer path to a position at which the desired pallet is not completely drawn out of the pallet-storing block, the mounting head sequentially picking up and mounting the desired electronic components on the circuit board when the desired pallet is in the position.

According to this preferred embodiment, the traveling distance of the desired pallet can be reduced similarly to the above embodiment, which makes it possible to reduce the tact time as a whole.

Further preferably, the electronic components are juxtaposed in the tray in a plurality of rows, the control means controlling the transfer means in a manner such that whenever the mounting head picks up a last electronic component to be picked up from each of the rows, the desired pallet is stepwise advanced to introduce another row of the rows into the pickup area.

Alternatively, the control means controls the transfer means in a manner such that after the desired pallet is moved to a position substantially closest to a position to which the circuit board is introduced, the desired pallet is moved by a slight distance so as to minimize a distance over which the mounting head is required to travel to pick up and mount each of the desired electronic components on the circuit board.

According to this preferred embodiment, the traveling distance of the mounting head is always minimized and hence it is possible to reduce the tact time. This control method is useful especially when pallets are not frequently replaced.

Alternatively, the electronic components are juxtaposed in the tray in a plurality of rows, the control means controlling the transfer means in a manner such that the desired pallet is first advanced to bring all of the rows of the electronic components into the pickup area, and then, starting with a rear end one of the rows, whenever the mounting head picks up a last electronic component to be picked up from each of the rows, the desired pallet is stepwise withdrawn toward the pallet-storing block.

Alternatively, the electronic components are juxtaposed in the tray in a plurality of rows, the control means controlling the transfer means in a manner such that whenever the mounting head picks up a last electronic component to be picked up from each of the rows introduced into the pickup area, the desired pallet is stepwise advanced to introduce another row of the rows into the pickup area, and that after the desired pallet is moved to a position substantially closest to a position to which the circuit board is introduced, the desired pallet is moved by a slight distance so as to minimize a distance over which the mounting head is required to travel to pick up and mount each of desired electronic components, and that before all electronic components to be mounted on the circuit boards are picked up from the desired pallet, whenever the mounting head picks up a last electronic component to be picked up from each of rows of remaining ones of the electronic components to be mounted, the pallet is stepwise withdrawn toward the pallet-storing block.

Preferably, the control means controls the transfer means in a manner such that the desired pallet is moved while the mounting head is operating to pick up and mount each of the desired electronic components.

According to this preferred embodiment, the operation of the mounting head and the transfer of the desired pallet can be systematically carried out and hence this control method is useful in reducing the tact time especially when pallets are frequently replaced.

Preferably, the pallet-storing block includes a pallet storage device for storing the pallets in a vertically spaced manner, the transfer means including a lift mechanism for vertically lifting and lowering the pallet storage device in a manner such that the desired pallet is brought to a level identical to a level of the transfer path.

To attain the first object, according to a second aspect of the invention, there is provided an electronic component-mounting apparatus comprising:

a pair of pallet-storing blocks for each storing a plurality of pallets each carrying thereon a tray containing a large number of electronic components, the pallet-storing blocks being arranged on respective opposite ends of a transfer path along which desired pallets drawn out respectively from the pallet-storing blocks are moved;

transfer means for moving the desired pallets along the transfer path in a manner such that each of the desired pallets is advanced to be brought into a pickup area or withdrawn from the pickup area toward the pallet-storing block;

component-mounting means for sequentially picking up desired electronic components from the each of the desired pallets brought into the pickup area and mounting the desired electronic components on a circuit board; and control means for controlling the transfer means in a manner such that the desired pallets are alternately introduced into the pickup area, and while one of the desired pallets has been introduced into the pickup area, another of the desired pallets is made on standby in the vicinity of the one of the desired pallets.

According to this preferred embodiment, pallets are alternately guided to the pickup area to cause one of the pallets to wait in the vicinity of the other pallet, whereby even when the pickup area is narrow and located far from the pallet-storing block, it is possible to reduce the time required for replacing pallets.

Preferably, the transfer means includes an engagement unit that carries out engagement with and disengagement from the desired pallet, and driving means for moving the engagement unit along the transfer path in a manner such that the engagement unit is advanced to the desired pallet or withdrawn from the desired pallet.

More preferably, the engagement unit comprises engaging arm means formed in a manner such that the engaging arm means is capable of engaging with and disengaging from each of the pallets, and conversion means for converting a driving force applied to the engagement unit by the driving means for urging the engagement unit toward the desired pallet into operations for the engagement with and disengagement from the desired pallet.

According to this preferred embodiment, the driving force of the driving means for drawing out and returning (moving forward and backward) the desired pallet can be converted by the conversion means into operation of the engaging arm means. Therefore, it is possible to omit a drive source dedicatedly provided for causing the engaging arm means to carry out the engaging and disengaging operations.

Further preferably, the conversion means comprises an arm support block for supporting the engaging arm means in a manner such that the engaging arm means is capable of engaging with and disengaging from each of the pallets, a body supporting the arm support block in a manner such that the arm support block is capable of moving along the transfer path relative to the body, the body being moved by the driving means in unison with the arm support block, a stopper for stopping the arm support block from advancing when the arm support block has moved in unison with the body to an engaging operation position, an actuating member fixed to the body, the actuating member causing the engaging arm means to carry out an operation for the engagement as the body is further advanced with respect to the arm support block, and carry out an operation for the disengagement as the body is withdrawn, in a state in which the arm support block is in stoppage.

According to this preferred embodiment, when the driving means causes the engagement unit i.e. the engaging arm means and the conversion means to advance toward the pallet-storing block, the advance of the arm support block is stopped at the engaging operation position by the stopper, while only the body is advanced in an overrunning manner. At this time point, the actuating member advancing in unison with the body causes the engaging arm means stopped at the engaging operation position to carry out the disengaging operation for disengaging from a pallet. Assuming that the engaging arm has a used pallet engaged therewith, the used pallet is returned to the pallet-storing block by this disengaging operation. Next, the withdrawal of the body starts. In accordance with the withdrawal of the body, the actuating member causes the engaging arm means stopped at the engaging operation position to carry out the engaging operation for engaging with a desired pallet. When the body continues to withdraw, the engaging arm means also starts moving backward to draw out the pallet. That is, the driving force of the driving means for drawing out and returning (moving forward and backward) the desired pallet can be converted by the conversion means into operation of the engaging arm means. Therefore, it is possible to omit a drive source dedicatedly provided for causing the engaging arm means to carry out the engaging and disengaging operations.

Further preferably, the engaging arm means comprises a pair of engaging arms arranged at respective locations opposed to each other in a direction transverse to the transfer path.

Still more preferably, the engaging arms each comprise an engaging block for engagement with the each of the pallets, an abutment portion against which the actuating member abuts to apply the driving force of the driving means thereto, and a connecting portion integrally formed with the engaging block and the abutment portion, the arm support block including a pivot for pivotally supporting the connecting portion, and urging means for urging the engagement block in an engaging direction.

Still further preferably, the urging means is a spring interposed between the pair of engaging arms.

Still more preferably, the transfer means includes guide means for supporting the desired pallet in a manner such that the desired pallet is movable along the transfer path.

Still further preferably, the guide means includes a plurality of guide blocks located at different levels, the engaging block comprises a plurality of engaging portions each formed at levels identical to the different levels of the guide blocks, respectively.

To attain the second object, according to a third aspect of the invention, there is provided a component-feeding device for an electronic component-mounting apparatus, comprising:

a pallet-storing block for storing a plurality of pallets each carrying thereon a tray containing a large number of electronic components; and transfer means for moving a desired pallet selected from the pallets along a transfer path, in a manner such that the desired pallet is advanced to a pickup position or withdrawn from the pickup position toward the pallet-storing block, the transfer means including an engagement unit that carries out engagement with and disengagement from the desired pallet, and driving means for moving the engagement unit along the transfer path in a manner such that the engagement unit is advanced to the desired pallet ox withdrawn from the desired pallet, the engagement unit comprising engaging arm means formed in a manner such that the engaging arm means is capable of engaging with and disengaging from each of the pallets, and conversion means for converting a driving force applied to the engagement unit by the driving means for urging the engagement unit toward the desired pallet into operations for the engagement with and disengagement from the desired pallet.

According to this component-feeding device, the driving force of the driving means for drawing out returning (moving forward and backward) the desired pallet can be converted by the conversion means into operation of the engaging arm means. Therefore, it is possible to omit a drive source dedicatedly provided for causing the engaging arm means to carry out the engaging and disengaging operations.

Preferably, the conversion means comprises an arm support block for supporting the engaging arm means in a manner such that the engaging arm means is capable of engaging with and disengaging from each of the pallets, a body supporting the arm support block in a manner such that the arm support block is capable of moving along the transfer path relative to the body, the body being moved by the driving means in unison with the arm support block, a stopper for stopping the arm support block from advancing when the arm support block has moved in unison with the body to an engaging operation position, an actuating member fixed to the body, the actuating member causing the engaging arm means to carry out an operation for the engagement as the body is further advanced with respect to the arm support block, and carry out an operation for the disengagement as the body is withdrawn, in a state in which the arm support block is in stoppage.

According to this preferred embodiment, when the driving means causes the engagement unit i.e. the engaging arm means and the conversion means to advance toward the pallet-storing block, the advance of the arm support block is stopped at the engaging operation position by the stopper, while only the body is advanced in an overrunning manner. At this time point, the actuating member advancing in unison with the body causes the engaging arm means stopped at the engaging operation position to carry out the disengaging operation for disengaging from a pallet. Assuming that the engaging arm has a used pallet engaged therewith, the used pallet is returned to the pallet-storing block by this disengaging operation. Next, the withdrawal of the body starts. In accordance with the withdrawal of the body, the actuating member causes the engaging arm means stopped at the engaging operation position to carry out the engaging operation for engaging with a desired pallet. When the body continues to withdraw, the engaging arm means also starts moving backward to draw out the pallet. That is, the driving force of the driving means for drawing out and returning (moving forward and backward) the desired pallet can be converted by the conversion means into operation of the engaging arm means. Therefore, it is possible to omit a drive source dedicatedly provided for causing the engaging arm means to carry out the engaging and disengaging operations.

The above and other objects, features, and advantages of the invention will become more apparent from the following detailed description taken in conjunction with the accompanying drawings.

BRIEF DESCRIPTION OF THE DRAWINGS

FIG. 5 is a diagram which is useful in explaining a third method of controlling operations of the pallet guide device and the component-mounting device, according to the first embodiment;

DETAILED DESCRIPTION

The invention will now be described in detail with reference to the drawings showing an embodiment thereof.

Figure 1:
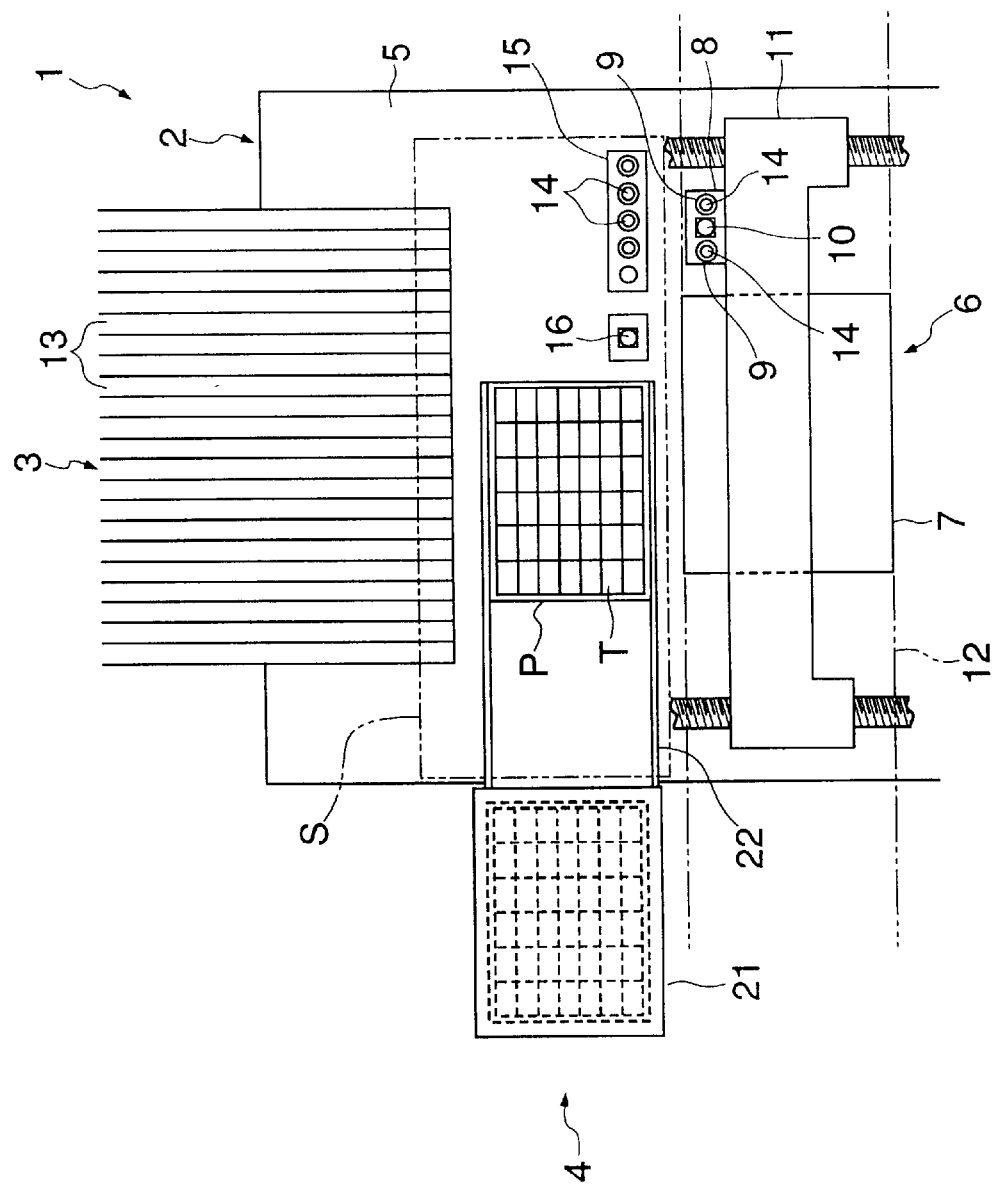
FIG. 1 is a plan view of an electronic component-mounting apparatus according to a first embodiment of the invention.

Referring first to FIG. 1, there is shown an electronic component-mounting apparatus according to the embodiment of the invention, which is a so-called multi-function chip mounter used for mounting various kinds of electronic components, such as surface-mounting components including chip capacitors, chip resistances, etc., and multi-lead components of flat package ICs, on circuit boards. The electronic component-mounting apparatus 1 includes a main block 2 of the apparatus for mounting supplied electronic components on a circuit board, a first electronic component feeder 3 for feeding small-sized electronic components, such as surface-mounting components, to the main block 2 of the apparatus, and a second electronic component feeder 4 for feeding large-sized electronic components, such as multi-lead components, to the main block 2 of the apparatus.

The main block 2 includes a base 5, a circuit board transfer device 6 having a setting table 7 arranged at a central portion of the base 5, a head unit 8 carrying thereon two mounting heads 9 and a board-sensing camera 10, and an X-Y stage 11 for moving the head unit 8 in an X-Y direction. That is, a component-mounting device (component-mounting means) is formed by the head unit 8 and the X-Y stage 11. The head unit 8 is brought to the first electronic component feeder 3 or the second electronic component feeder 4 by operation of the X-Y stage 11 for at least one of the mounting heads 9 to pick up an electronic component, and then mount the electronic component on a circuit board set on the setting table 7. When the above operation is repeatedly carried out to complete the mounting of electronic components on the circuit board, the circuit board transfer device 6 sends forward the circuit board along a transfer passage 12, and thereafter a new circuit board is set on the setting table 7 in place of the delivered circuit board.

The first electronic component feeder 3 is comprised of a lot of cassette-type tape feeders 13 arranged in parallel with each other on one side of the base 5 in a direction perpendicular to the one side that is parallel to the transfer passage 12, such that each tape feeder 13 has a front end thereof facing toward a pickup area S at which the mounting heads 9 pick up electronic components. Electronic components are contained in each tape feeder 13 in a state loaded on a carrier tape, not shown, to be fed from the front end of the tape feeder 13 one by one.

The second electronic component feeder 4 is arranged on another side of the base 5 at right angles to the one side of the base 5 on which the first component feeder 3 is arranged. In the second electronic component feeder 4, a lot of electronic components are juxtaposed in each of a single or a plurality of trays T carried on the pallet P. The pallet P is brought to the pickup area S between the first electronic component feeder 3 and the setting table 7 to thereby supply the electronic components to the main block 2 of the apparatus.

On the other hand, each mounting head 9 has a vacuum nozzle 14 removably mounted on a lower end thereof, for picking up an electronic component by vacuum. There are provided a plurality of kinds of vacuum nozzles for replacement according to the horizontal contour or the weight of each electronic component to be picked up. In the present embodiment, a plurality of kinds of vacuum nozzles 14 for replacement are contained in a nozzle storage device 15 arranged on the top of the base 5, such that the vacuum nozzles 14 are positioned therein in parallel with each other.

Further, at a position near the nozzle storage device 15, there is arranged a component-sensing camera 16 for sensing or recognizing the position of each electronic component picked up by the vacuum nozzle 14. Before the electronic component picked up by the vacuum nozzle 14 is mounted on the circuit board, its amount of displacement from its proper position in an X direction, in a Y direction, and in a θ direction (defined by a rotational angle of the electronic component on a horizontal plane) with respect to the axis of the vacuum nozzle 14 is detected by the component-sensing camera. And, based on the detected amount of displacement, the position in the θ direction of each electronic component is corrected by the rotation of the vacuum nozzle 14 and the positions in the X direction and in the Y direction are corrected by the X-Y stage 11.

Figure 2:
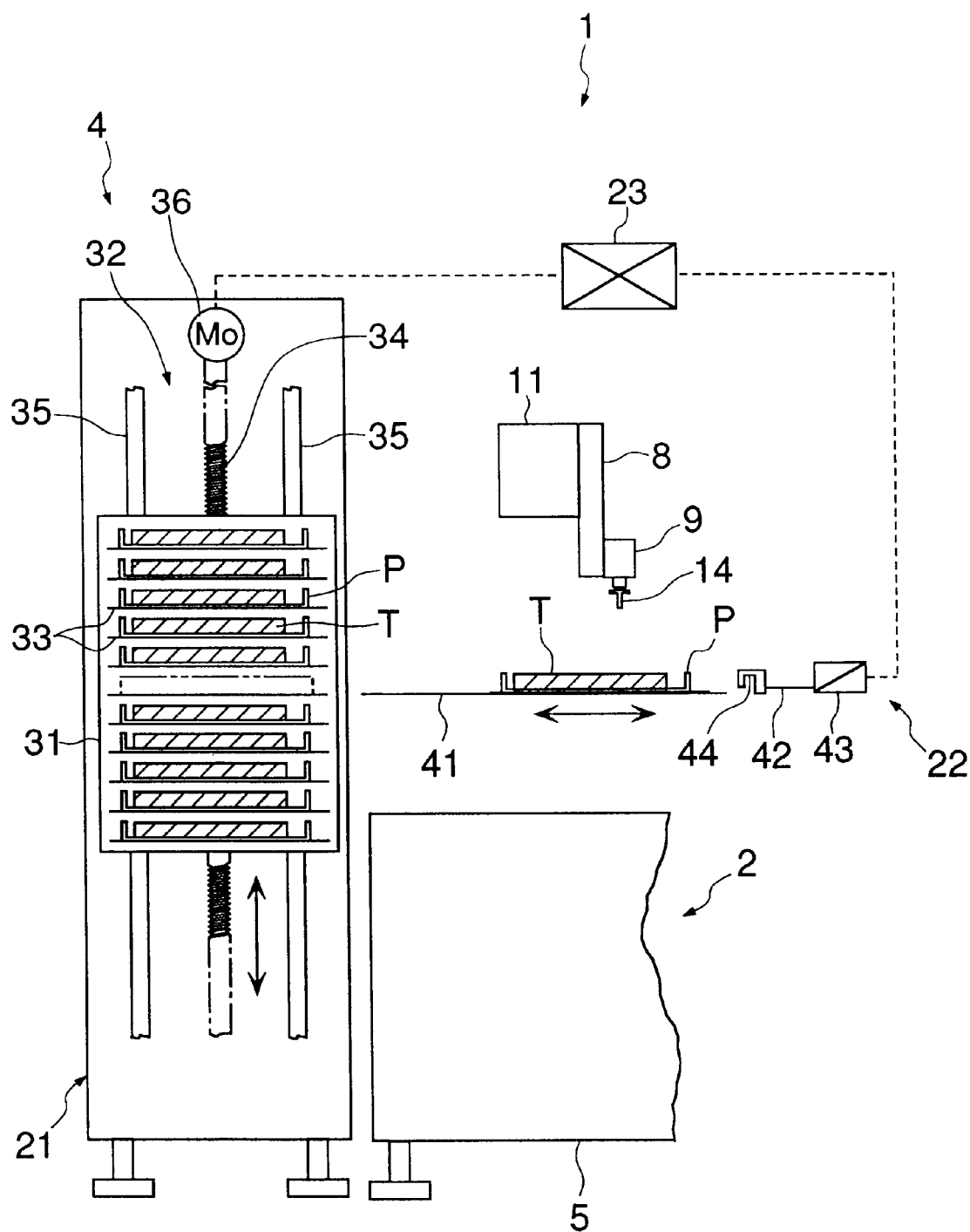
FIG. 2 is a side view of the electronic component-mounting apparatus according to the first embodiment.

Next, the second electronic component feeder 4 will be described in detail with reference to FIGS. 1 and 2. The second electronic component feeder 4 is comprised of an elevating mechanism (pallet-storing block) 21 for holding a lot of pallets P in stock as well as vertically moving each pallet P to a predetermined level, and a pallet guide device (pallet transfer means) 22 for horizontally moving the pallet P at the predetermined level from the elevating mechanism 21 to the pickup area S of the main block of the apparatus 2. It should be noted that the pickup area S in the present embodiment is expanded to the immediate vicinity of the elevating mechanism 21.

The elevating mechanism 21 is comprised of a pallet storage device 31 for storing a lot of pallets P in a vertically-spaced manner, and a lift mechanism 32 for lifting and lowering the pallet storage device 31 to thereby lift and lower the pallets P contained therein. The pallet storage device 31 is comprised of a lot of shelves 33 arranged in a vertically-spaced manner for placing pallets P thereon. The pallet storage device 31 has a wide opening on a right-hand side thereof as viewed in FIG. 2, through which each pallet P is selectively drawn out toward the main block 2.

The lift mechanism 32 is comprised of a frame, not shown, for holding the pallet storage device 31, a ball screw 34 extending through a portion of the frame for lifting and lowering the same, a pair of guide rails 35, 35 arranged on opposite sides of the ball screw 34 for guiding upward and downward movements of the frame, and a lift motor 36 connected to a root-side end of the ball screw 34 for rotating the ball screw 34. The lift motor 36 operates to rotate the ball screw 34 in a normal or reverse direction to thereby lift or lower the frame along the guide rails 35, 35. As the frame is lifted and lowered, the pallet storage device 31 held by the frame is lifted and lowered together with the pallets P contained therein.

In the elevating mechanism 21 thus constructed, the lift motor 36 of the lift mechanism 32 is connected to a controller 23 to have the lifting/lowering operation thereof controlled by the controller 23. By the lifting/lowering operation of the lift motor 36, a desired shelf 33 in the pallet storage device 31 is set to the same level as a transfer path 41 of the pallet guide device 22, described hereinafter. In a normal lifting/lowering operation, an empty shelf 33 is caused to be on standby at the level for receiving a used pallet P, while a new pallet P is moved to the level to pass the same to the pallet guide device 22.

On the other hand, the pallet guide device 22 is comprised of the transfer path 41 (that is, means providing the path) arranged on the base 5 of the main block 2, an engaging arm 42 horizontally advancing and withdrawing along the transfer path 41, and a drive mechanism 43 causing the engaging arm 42 to advance and withdraw. The engaging arm 42 has an end formed with a hook 44 for engagement with and disengagement from each pallet P. The engaging arm 42 is advanced by the drive mechanism 43 to cause the hook 44 to engage with an end of the pallet P received in the elevating mechanism 21, and then the engaging arm 42 is withdrawn to guide the pallet P along the transfer path 41 to the pickup area S.

The drive mechanism 43 is also connected to the above controller 23 and operated in a manner interlocked with the elevating mechanism 21. Further, the component-mounting device comprised of the head unit 8 and the X-Y stage 11 is connected to the controller 23 such that the pallet guide device 22 and the component-mounting device cooperate with each other. That is, the pickup area S is expanded to the immediate vicinity of the elevating mechanism 21, and the pallet guide device 22 is constructed such that each pallet P can be guided to a desired position on the transfer path 41 in the pickup area S and such that each mounting head 9 of the component-mounting device can pick up a desired one of electronic components on the guided pallet P.

Now, a plurality of methods of controlling operations of the pallet guide device 22 and the component-mounting device by the above controller 23 will be described with reference to FIGS. 3A to 6C. It should be noted that these control methods are adopted assuming that the shorter the distance over which each mounting head 9 has to travel in the horizontal direction, the shorter the tact time for mounting electronic components A on each circuit board, and that the pallet guide device 22 guides each pallet much more slowly than each mounting head 9 carries out a sequence of operations including a traveling operation.

Figure 3A:
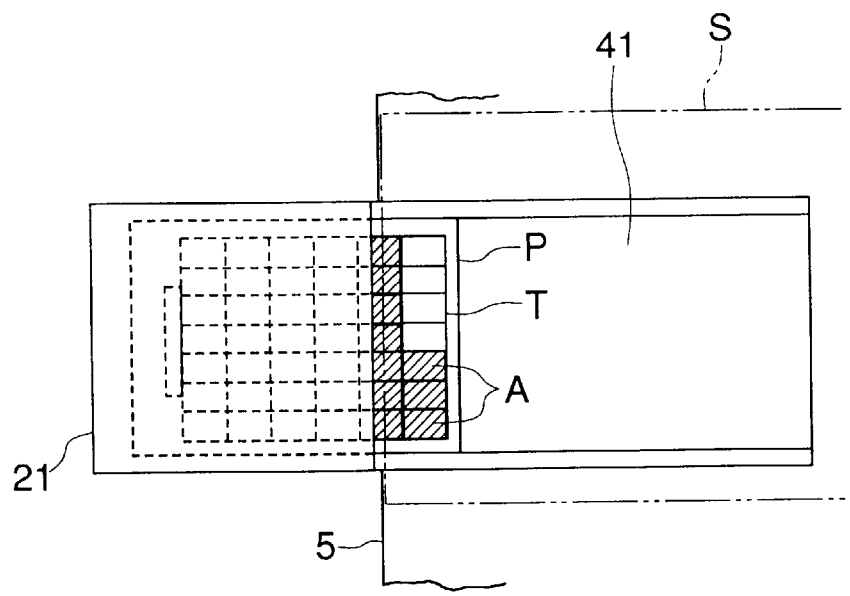
FIGS. 3A and 3B are diagrams which are useful in explaining a first method of controlling operations of a pallet guide device and a component-mounting device, according to the first embodiment.
Figure 3B:
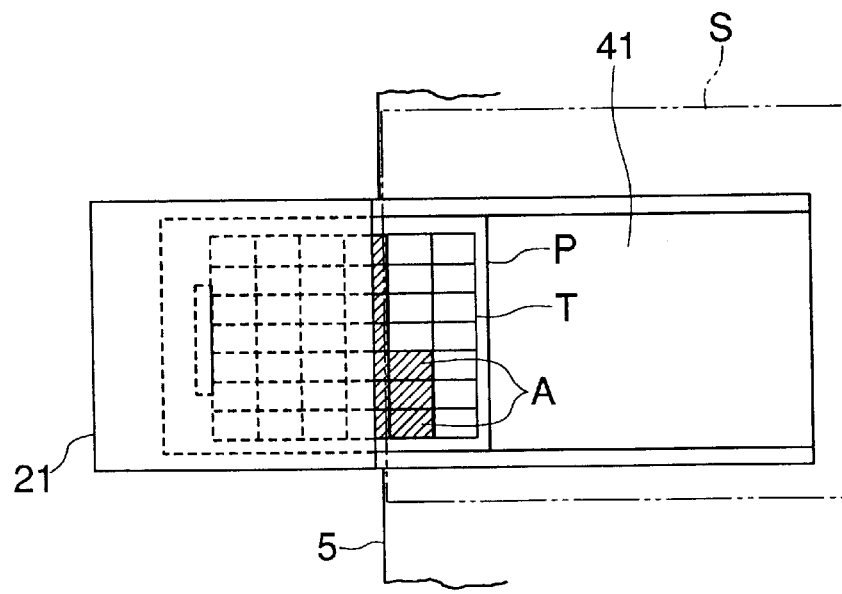

FIGS. 3A to 3B show a first control method which is employed when pallets P are frequently replaced. As shown in FIG. 3A, first when a pallet P is drawn out from the elevating mechanism 21 to a position at which a first row of electronic components A in a tray T on the pallet P has entered the pickup area S, the pallet P is stopped, and then the electronic components A in the first row are sequentially mounted (picked up). When all the electronic components to be picked up from the first row are picked up, while the mounting head 9 is mounting the last electronic component A picked up from the first row onto the circuit board, the pallet P is moved such that electronic components A in a second row are guided into the pickup area S, as shown in FIG. 3B. Thereafter, the electronic components A in the second row are mounted (picked up). When the above operation is repeatedly carried out to complete the mounting of all required electronic components A onto the circuit board, the pallet P is returned to the elevating mechanism 21 and another pallet P is drawn out into the pickup area S, by following the same procedure described above. Of course, the stepwise motion of each pallet P is carried out during execution of electronic component-pickup and mounting operations by the mounting head(s) 9.

As described above, the horizontal movement of each pallet P can be minimized to thereby reduce the time required for replacing (guiding) pallets P. Although this increases the traveling distance of each mounting head and accordingly it takes a longer time period to carry out the operation for mounting each electronic component A, the mounting head 9 can perform its operation very fast, so that it is possible to reduce the tact time (mounting time per circuit board) as a whole than when each mounting head 9 has to wait to be permitted to start its operation. Furthermore, if a tray T is placed in a pallet P at a location as close to a forward end thereof as possible, the mounting of electronic components A on a circuit board can be completed in a state where the whole pallet P is not completely drawn out from the elevating mechanism 21, which makes it possible to replace pallets P in a still more shorter time period. Alternatively, inversely to the above manner, a pallet P may be drawn out to a position outward enough to pick up electronic components A in a last row first, thereby returning the pallet P to the elevating mechanism 21 whenever the mounting of electronic components A in each raw has been completed. More specifically, the pallet P is first advanced to bring all of the rows of the electronic components A into the pickup area S, and then, starting with a rear end one of the rows, whenever the mounting head 9 picks up a last electronic component A to be picked up from each of the rows, the pallet P is stepwise withdrawn toward the elevating mechanism by a distance of each row. This method as well makes it possible to reduce the tact time.

Figure 4:
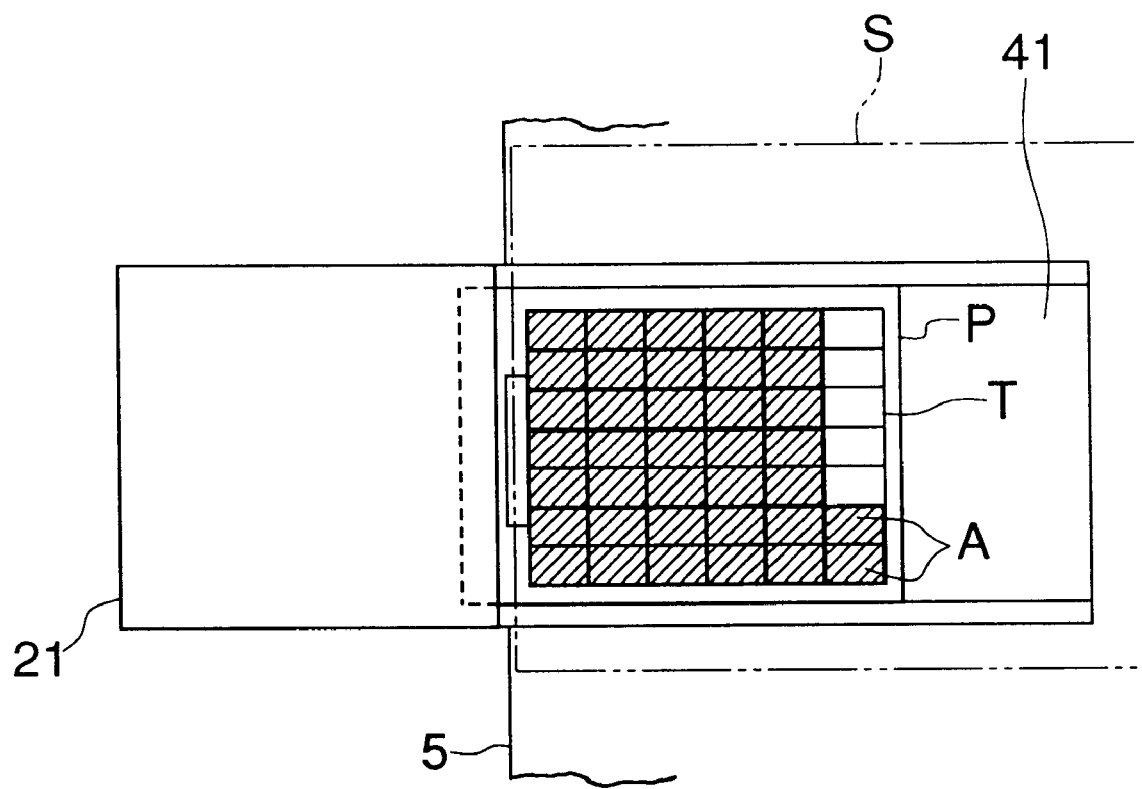
FIG. 4 is a diagram which is useful in explaining a second method of controlling operations of the pallet guide device and the component-mounting device, according to the first embodiment.

FIG. 4 shows a second control method. According to the second method, when all the electronic components A contained on a tray T are drawn out from the elevating mechanism 21 to enter the pickup area S, the horizontal movement of a pallet P carrying the tray T is stopped. In this state, the electronic components A are mounted (picked up), whereby it is possible to simplify the control of the horizontal movement of the pallet P. Further, the distance over which each mounting head 9 has to travel to pick up electronic components e.g. in the first and second rows can be reduced.

FIG. 5 shows a third control method which is employed when pallets P are not frequently replaced. As shown in the figure, a pallet P is first guided to a position near a circuit board B. To pick up electronic components A from a first row in a tray T on the pallet P. the pallet P is guided in a manner such that the first row and the circuit board B become closest to each other, more strictly in a manner such that electronic components A in the first row and an electronic component-mounting position at the circuit board B become closest to each other. Then, the electronic components A in the first row are sequentially mounted (picked up). Then, the pallet P is very slightly moved such that electronic components A in a second row are brought closest to the circuit board B, and then the electronic components A in the second row are sequentially picked up. By repeatedly carrying out the above operations, all the required electronic components A on the tray T are mounted (picked up).

By using the above method, the traveling distance of each mounting head 9 is minimized and hence it is possible to effectively reduce the tact time. When this method is adopted, if a plurality of kinds of electronic components A are carried on a tray T on a pallet P, the electronic component-mounting efficiency can be further enhanced. Further, if pallets P are replaced while the first electronic component feeder 3 is being accessed for mounting electronic components A on the first electronic component feeder 3, it is possible to eliminate time losses wasted for replacing pallets P.

Figure 6A:
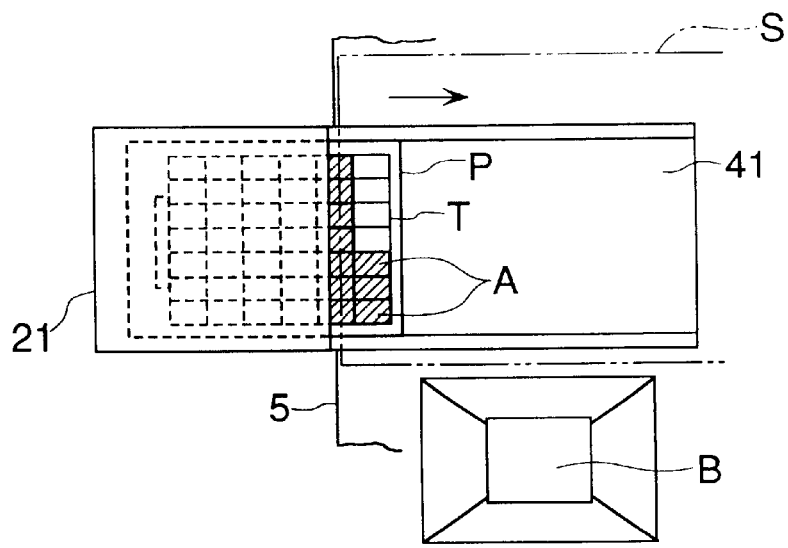
FIGS. 6A to 6C are diagrams which are useful in explaining a fourth method of controlling operations of the pallet guide device and the component-mounting device, according to the first embodiment.
Figure 6B:
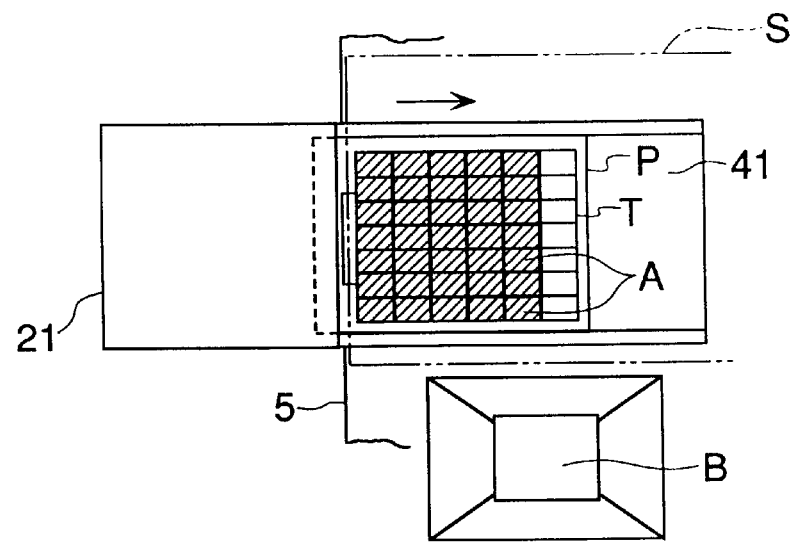
Figure 6C:
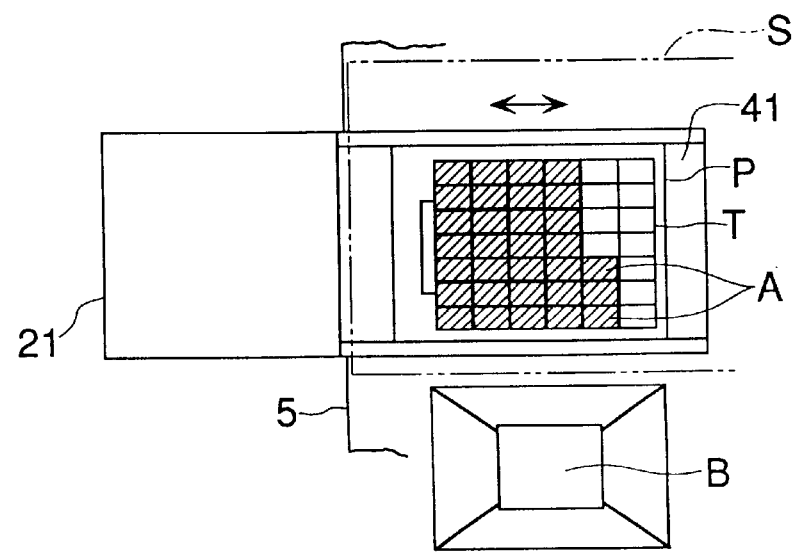

FIGS. 6A to 6C show a fourth control methods which is employed to minimize a waiting time period of each mounting head 9. As shown in the figures, only electronic components A in a first row in a tray on a pallet P are first guided into the pickup area S by the same method as the first control method, and an electronic component A is picked up from the first row. While the mounting head 9 is mounting the picked-up electronic component A on a circuit board B, the pallet P is moved. By repeatedly carrying out the above operations, the pallet P is brought closer to the circuit board B. After the pallet P is brought to a position substantially closest to the circuit board B, by the same method as the third control method, electronic components A are sequentially picked up while moving the pallet P very slightly to a most suitable position. A little before all the electronic components A on the pallet P have been mounted on the circuit board B, by the reversed procedure, remaining electronic components A are sequentially picked up and mounted as the pallet P is moved backward to the elevating mechanism 21.

By using the above method, it is possible to minimize not only the waiting time period of each mounting head 9 but also the traveling distance thereof, so that the tact time can be largely reduced. It goes without saying that a control method may be adopted in which the above control methods are combined with each other as required.

Next, a second embodiment of the invention will be described with reference to FIGS. 7 and 8. Component parts and elements similar to those of the first embodiments are designated by identical reference numerals, and detailed description thereof is omitted. As shown in the figures, according to the second embodiment, a pair of elevating mechanisms 21 and a pair of pallet guide devices 22 are arranged in a manner sandwiching a pickup area S therebetween. In this embodiment, a controller 23 controls both of the pallet guide devices 22, 22 (and the elevating mechanism 21, 21) at the same time, causing each of them to alternately guide a pallet P into the pickup area s. Further, while electronic components on one pallet P are being picked up, the other pallet P is caused to wait for its turn for operation in the vicinity of the one pallet P.

Figure 7:
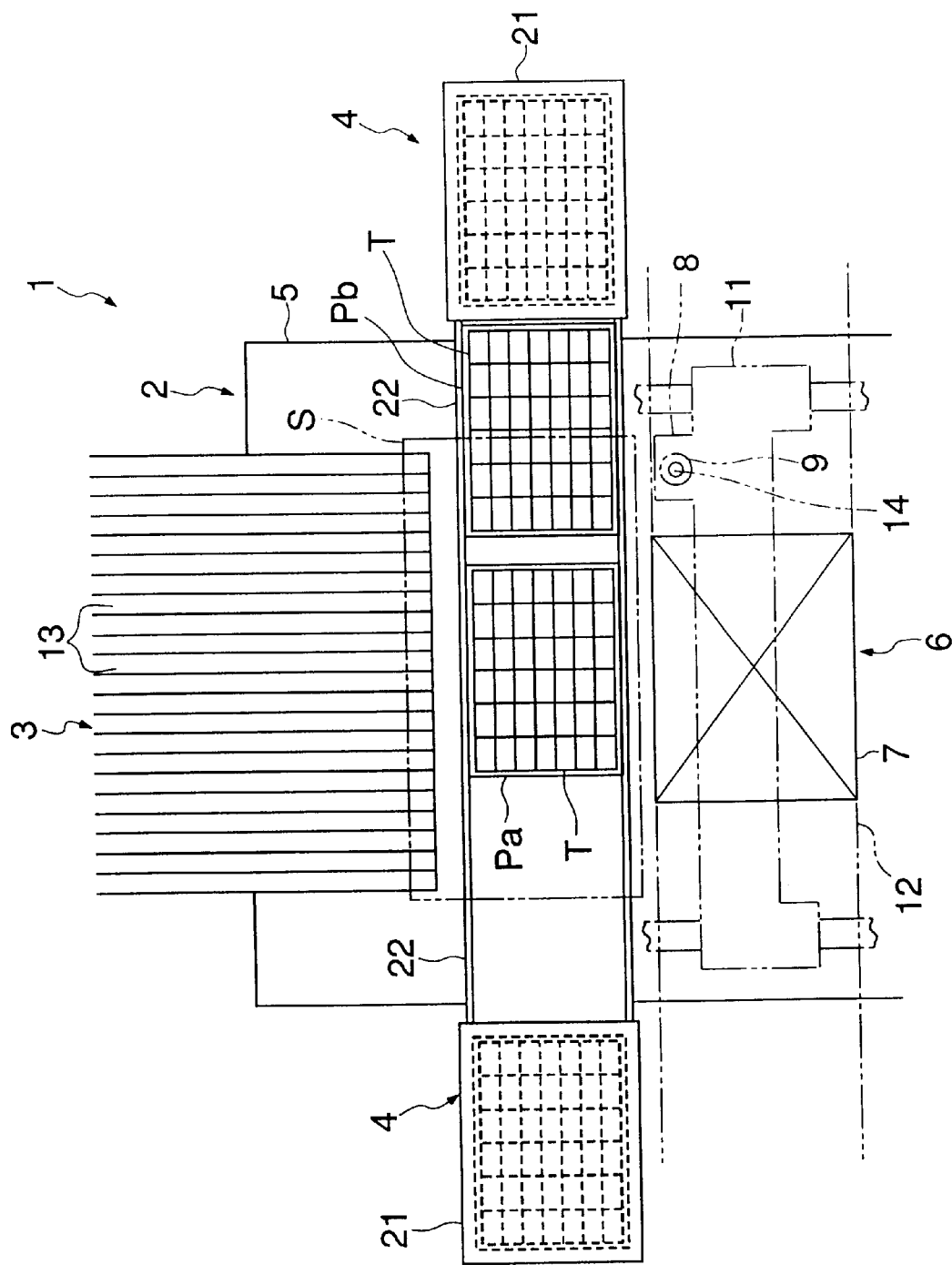
FIG. 7 is a plan view of an electronic component-mounting apparatus according to a second embodiment of the invention.
Figure 8:
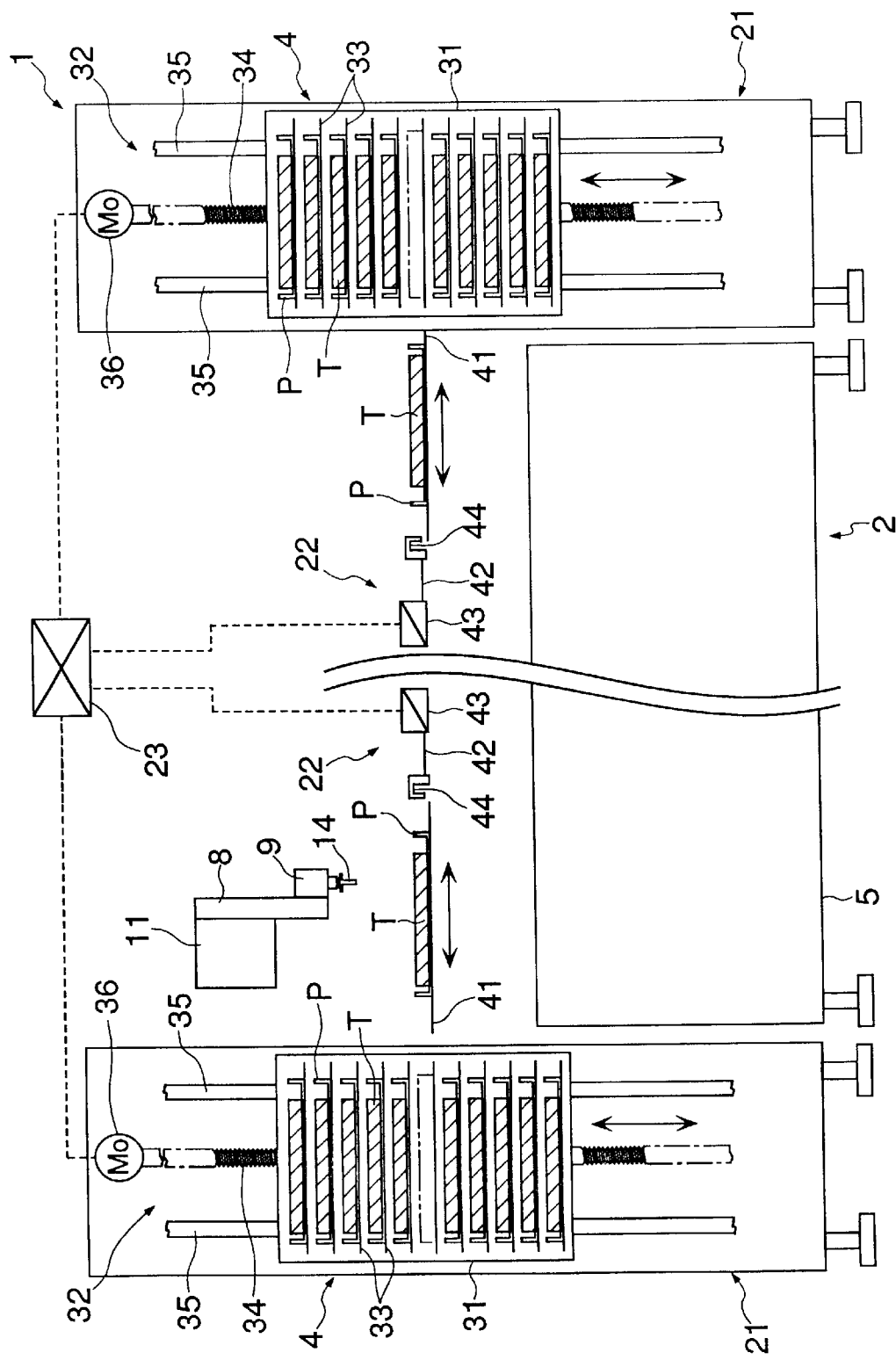
FIG. 8 is a side view of the electronic component-mounting apparatus according to the second embodiment.

More specifically, as shown in FIG. 7, when electronic components are being sequentially picked up from a left-hand pallet Pa guided to the vicinity of a circuit board from a left-hand elevating mechanism 21, a right-hand pallet Pb loaded with electronic components to be picked up (mounted) next is guided to the vicinity of the left-hand pallet Pa from a right-hand elevating mechanism 21. When all the required electronic components have been sequentially picked up and mounted by the left-hand pallet Pa and the left-hand pallet Pa is moved backward to the left-hand elevating mechanism 21, the right-hand pallet Pb is guided to the position occupied by the left-hand pallet Pa in its place. While electronic components are being picked up from the right-hand pallet Pb, a new pallet Pa is guided (for replacement of pallets) from the left-hand elevating mechanism 21 to wait for its turn in the vicinity of the right-hand pallet Pb.

According to the above construction of the second embodiment, although a time period for transfer of each pallet P can not be shortened, a time period for replacing one pallet P by another is extremely reduced for operation of the mounting head 9, whereby it is possible to reduce the tact time as a whole. Furthermore, the above methods of the first embodiment can be also applied to individual pallets P in the second embodiment.

Figure 9:
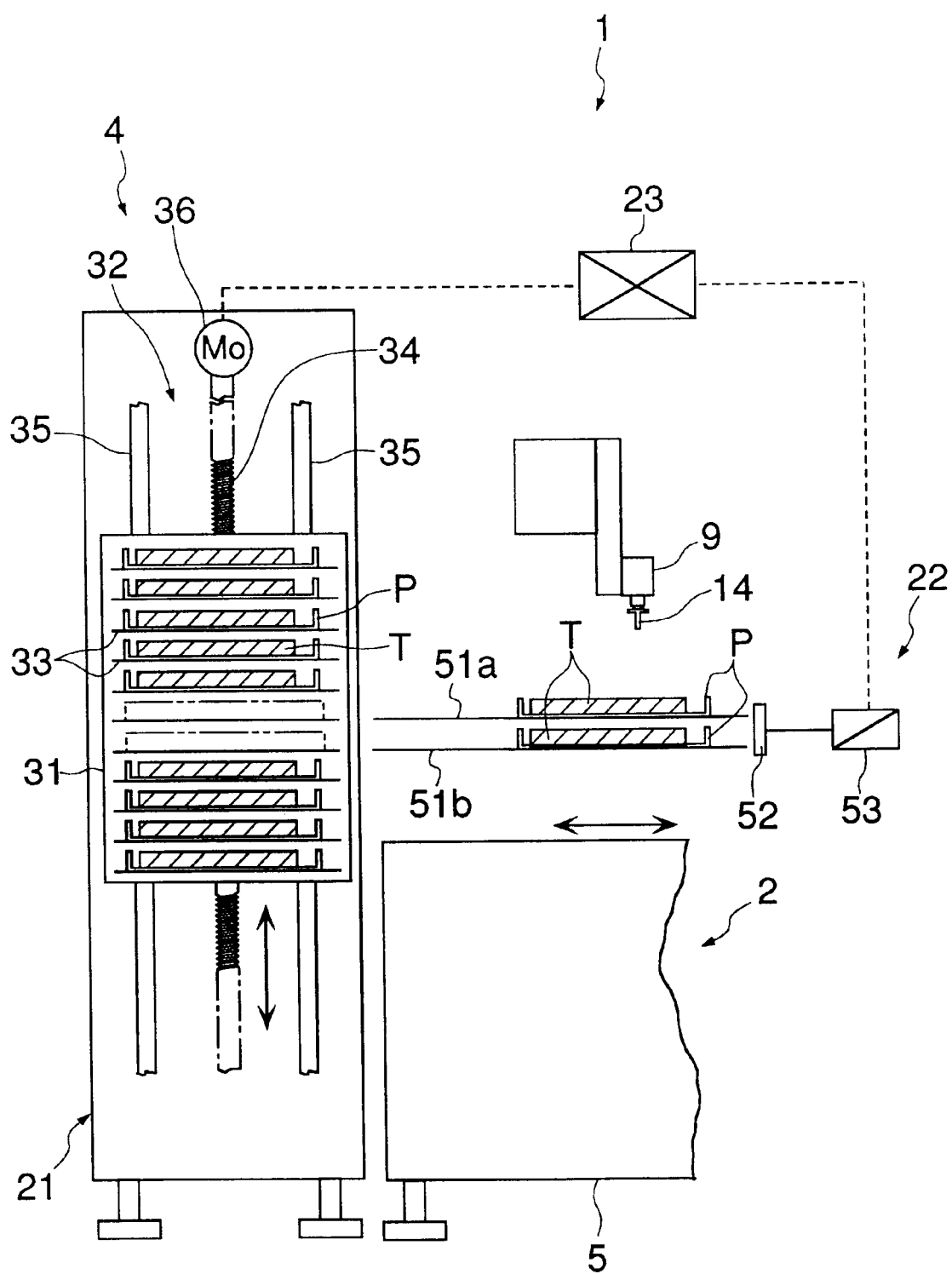
FIG. 9 is a side view of an electronic component-mounting apparatus according to a third embodiment of the invention.

Next, a third embodiment of the invention will be described with reference to FIG. 9. Component parts and elements similar to those of the first embodiments are designated by identical reference numerals, and detailed description thereof is omitted. According to the third embodiment, in the lifting/lowering operation of a lift motor 36 controlled by a controller 23, two desired shelves 33 in a pallet storage device 31 are set to the same levels as respective levels of two upper and lower transfer paths 51a, 51b of a pallet guide device 22, described hereinafter. The apparatus is configured such that shelves 33 are arranged in the pallet storage device 31 such that the space between two vertically adjacent shelves are approximately equal to that between two transfer paths 51a, 51b.

The pallet guide device 22 sets each of the two pallets P to the same level as a corresponding one of the two transfer paths 51a, 51b to make the same on standby in the elevating mechanism 21, and selectively draws out the pallets P along the transfer paths 51a, 51b so as to guide the selected pallet to the pickup area. The pallet guide device 22 is comprised of an engaging arm unit 52 which is brought to the elevating mechanism 21 for engagement with each pallet P, and a drive mechanism 53 causing the engaging arm unit 52 to horizontally advance and withdraw along the transfer paths 51a, 51b. The drive mechanism 53 is also connected to the above controller 23 so as to be controlled thereby in a manner interlocked with the elevating mechanism 21.

Figure 10A:
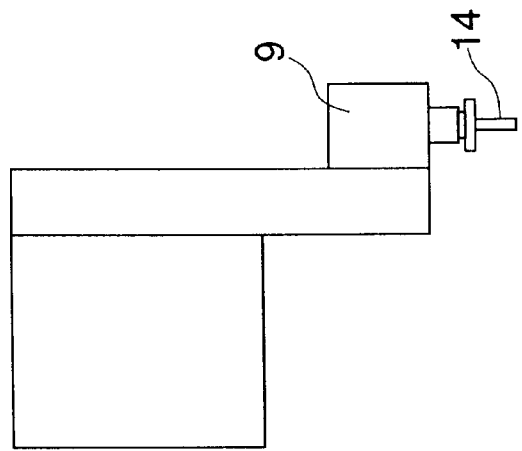
FIGS. 10A and 10B are diagrams which are useful in explaining the manner of suitably using level 1 and level 2.
Figure 10B:
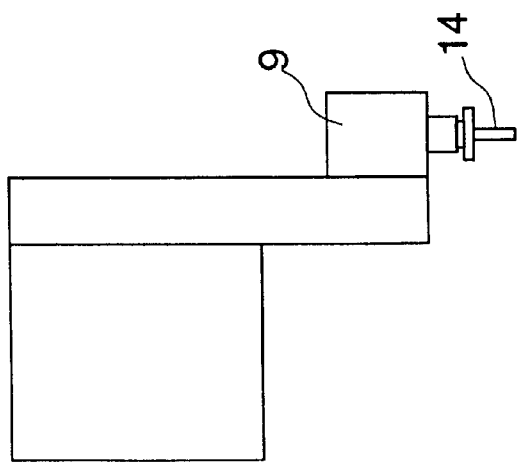

Now, before describing the engaging arm unit 52 and the drive mechanism 53, the manner of selectively using one of the above-mentioned two transfer paths 51a, 51b will be briefly explained with reference to FIGS. 10A and 10B. As shown in the figures, the two transfer paths 51a, 51b are arranged such that the upper transfer path 51a is located at level 1 and the lower transfer path 51b is at level 2. The elevating mechanism 21 brings each pallet P to level 1 or level 2, as required. A pallet P on which a thin tray Ta small in height is set is supplied from level 1, whereas a pallet P on which a thick tray Tb large in height is set thereon is supplied from level 2.

As described above, small-height trays Ta are guided to level 1 and large-height trays Tb are guided to level 2 and hence the level of the top surface of each tray T in the pickup area is not adversely affected by the height of the tray T and the difference in level between the trays in the pickup area is minimized. Therefore, it is only required that the reference level at which each mounting head 9 is moved is set to the level of the top surface of a tray T or stack of trays T at the highest level among the trays T or stacks of trays T to be guided to the pickup area, irrespective of their heights. That is, the lowering (lifting) stroke of the mounting head 9 for picking up each electronic component can be minimized. In this case, whether a pallet P should be set at level 1 or level 2 is determined by processing of data items input from a height sensor, not shown in FIGS. 10A and 10B, or the controller 23 in advance.

Figure 11:
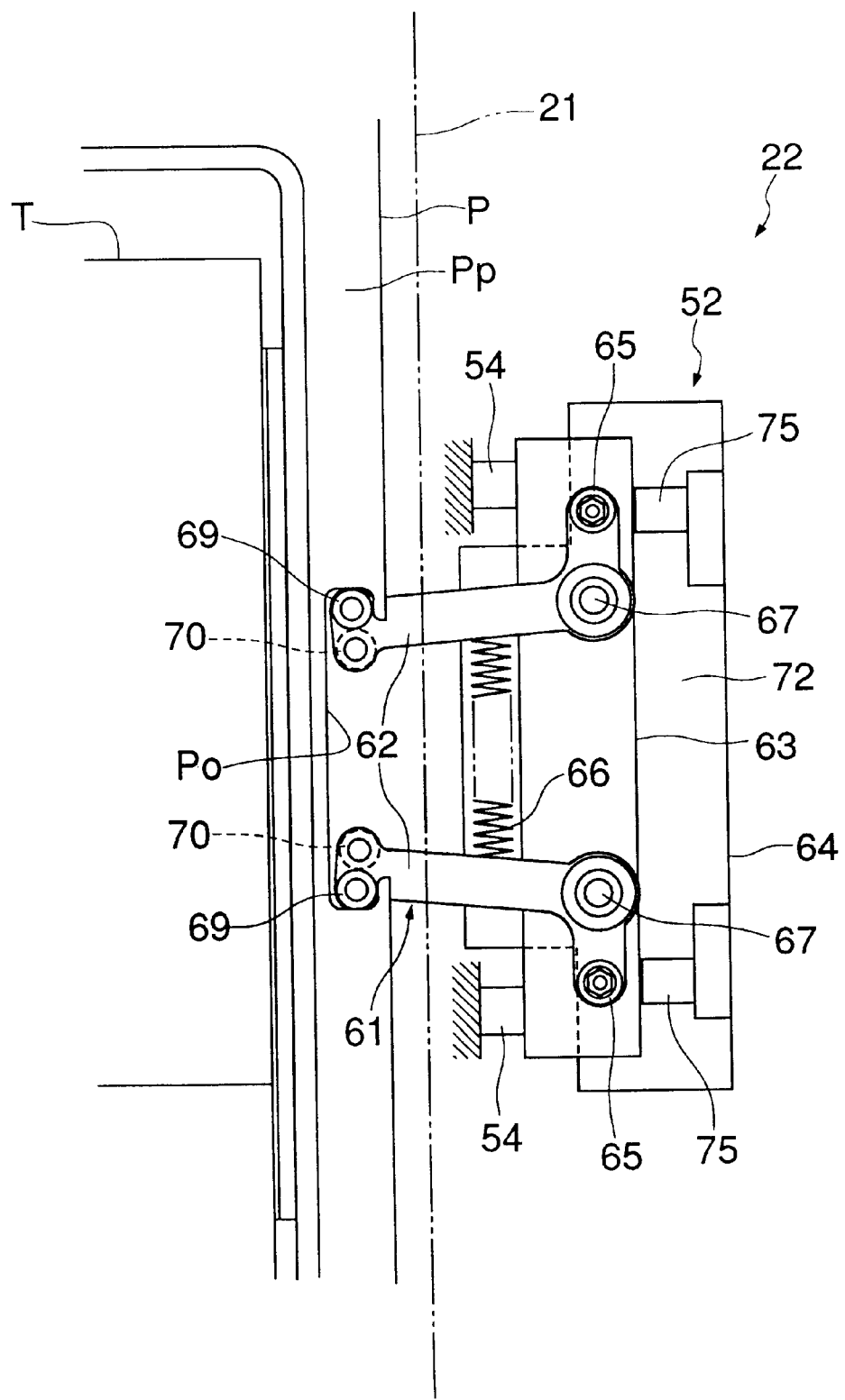
FIG. 11 is a plan view of an engaging arm unit of the pallet guide device and component parts associated with the engaging arm unit.
Figure 12:
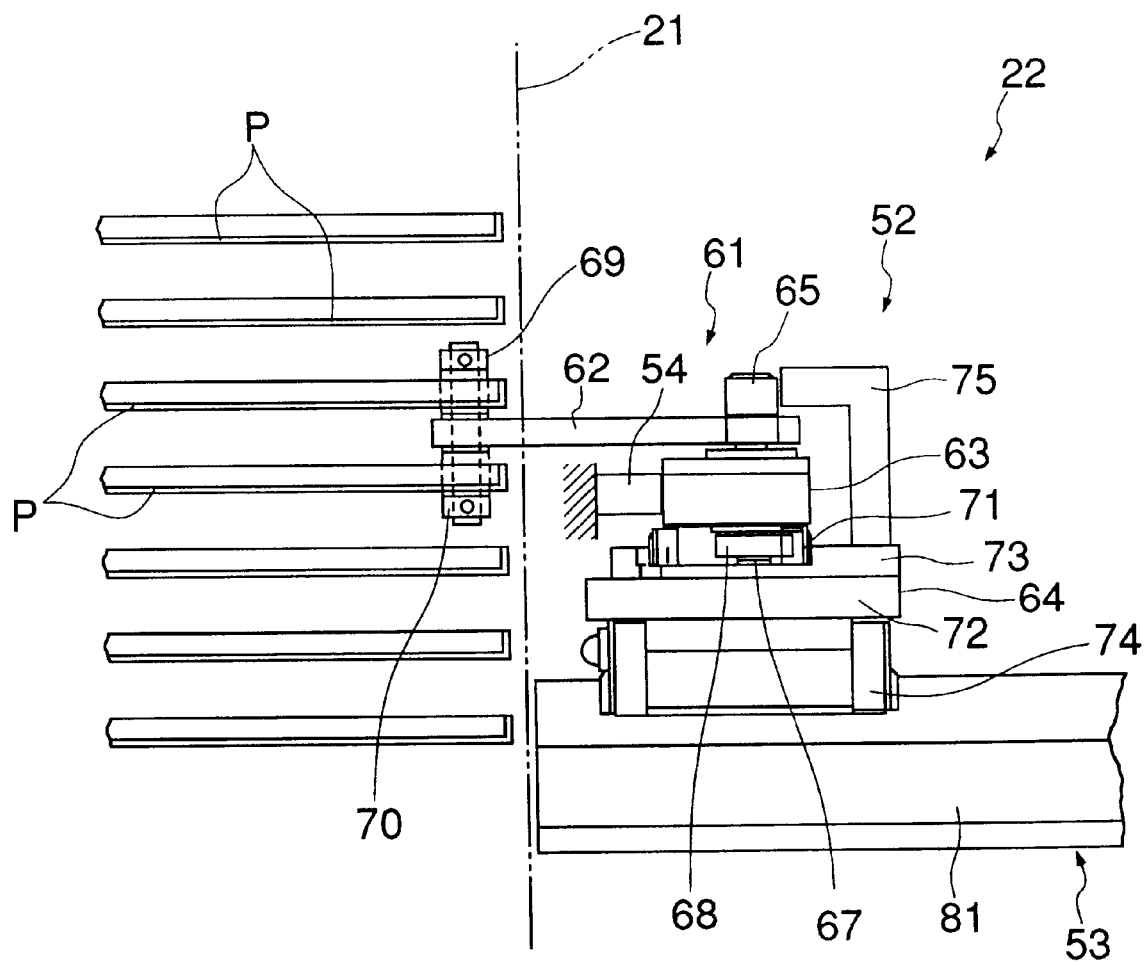
FIG. 12 is a side view of the engaging arm unit of the pallet guide device and component parts associated with the engaging arm unit.

Referring to FIGS. 11 and 12, the engaging arm unit 52 is comprised of engaging arm means 61 formed of a pair of arm portions 62, 62, an arm support block 63 rotatably supporting each of the pair of arm portions 62, 62 thereon and a main unit (body) 64 supporting the arm support block 63 in a manner movable forward and backward in a direction of moving pallets P. The pair of arm portions 62, 62 are generally L-shaped respectively and arranged in line symmetry with respect to an imaginary center line on the arm support block 63. The arm portions 62, 62 are each rotated about bent portions thereof in opposite directions to each other on a common horizontal plane. Further, each arm portion 62 has a tail end formed with a circular projection 65 projecting upward and each of the circular projections 65 is abutted by a corresponding one of a pair of operating members 75 of the main unit 64 to thereby rotate the arm portions 62. Furthermore, a compression spring 66, which is schematically shown in FIG. 11, is stretched between the pair of arm portions 62, 62 for urging the same in a direction of opening them, that is, in a direction of engagement with a pallet P. A rotational shaft 67 of each arm portion 62 extends through the arm support block 63 in a vertical direction, and on a lower end of each rotational shaft 67 there is provided a control circular plate 68 for abutting part of the arm support block 63 to control the extreme position of rotation of each arm portion 62 in the direction of opening the same.

Further, on a front end of each arm portion 62 there are mounted a first engaging block 69 projecting upward in the form of a pin and a second engaging block 70 projecting downward in the form of a pin, respectively. The first engaging block 69 and the second engaging block 70 are arranged in a manner slightly deviating from each other in the direction of rotation of the arm portion 62 on a horizontal plane such that the first engaging block 69 is engaged with an arm-holding portion Po of a pallet P prior to the second engaging block 70. More specifically, each arm portion 62 is arranged such that the same is brought into a gap between pallets P on standby on the above level 1 and level 2, and the first engaging block 69 is engaged with a pallet P at level 1, while the second engaging block 70 is engaged with a pallet P at level 2.

Therefore, when both of the arm portions 62, 62 carry out engaging operations (arm portion-opening operations) in a state where both the pallets P are on standby at Level 1 and level 2, respectively, the first engaging block 69 of each arm portion 62 engages with the pallet P at level 1, whereas the second engaging block 70 of each arm portion 62 can not engage with the pallet P at level 2 to remain in a disengaged state. It goes without saying that the above case can also be realized when the engaging operations are carried out in a state where only one pallet P is on standby at level 1 alone. Further, in a state where only one pallet P is on standby at level 2 alone, the second engaging block 70 engages with the pallet P at level 2 (see FIGS. 13A and 13B). That is, the above engaging arm means 61 engages with the pallet P at the upper level (level 1) so as to draw out the same prior to the pallet at the lower level (level 2).

As described above, in each arm portion 62, the first engaging block 69 at the upper level and the second engaging block 70 at the lower level are provided in a manner deviating from each other in the direction of rotation of the arm portion 62, so that single engaging arm means 61 is capable of selectively engaged with upper and lower pallets P with preference to the pallet P at the upper level. That is, it is possible to draw out the pallet P at the upper level prior to one at the lower level by mechanical means having a simple construction.

On the other hand, an arm-holding portion Po of each pallet P is formed by cutting out part of a level edge portion Pp of the pallet P such that the cutout takes the shape of the letter "C". The arm portions 62, 62 engages with and disengages from each pallet P in a state brought into the arm-holding portion Po of the pallet P, so that when the engaging arm means 61 is disengaged from pallets P, it is possible to move each pallet P in the vertical direction without withdrawing the engaging arm means 61. For example, after a used pallet P is returned to the elevating mechanism 21 to disengage it from the engaging arm means 61, if a new pallet P is brought to the engaging arm means 61, it is possible to instantaneously engage the engaging arm means 61 with the pallet P.

The arm support block 63 supporting the engaging arm means 61 thereon has a lower portion formed with a sliding block 71 which is engaged with a rail block 73 of the main unit 64, described hereinafter, in a manner movable forward and backward i.e. in the direction of moving pallets P. Further, when the engaging arm means 61 advances to an engaging operation position, a pair of stoppers 54, 54 abut against the arm support block 63.

The main unit 64 is comprised of a base 72, the rail block 73 (FIG. 12) projecting upward from the base 72 and a slider 74 provided on the underside of the base 72. The slider 74 engages with a center rail 81, described hereafter, of the drive mechanism 53. The main unit 64 is guided by the center rail 81 to be moved forward and backward in the direction of moving pallets P. Further, on top of the base 72 are rigidly mounted the pair of actuating members 75, 75 which abut the above pair of arm portions (circular projections 65) 62, 62 to cause the engaging arm means 61 to carry out the disengaging operation from a pallet P against the urging force of the above-mentioned compression spring 66.

Now, a sequence of operations for engagement with and disengagement from a pallet P executed by the engaging arm unit 52 will be described with reference to FIGS. 13A and 13B. The engaging arm unit 52 is caused to advance along the center rail 81 by the drive mechanism 53 so as to return a used pallet P to the elevating mechanism 21 and when the engaging arm means 61 has reached the engaging operation position, i.e. when the used pallet P is received by the elevating mechanism 21, the arm support block 63 hits the stoppers 54, 54, whereas the main unit 64 further advances in a manner overrunning the stoppers 54. Then, the pair of actuating members 75, 75 of the main unit 64 hit the arm portions 62, 62 to urge the same. By the urging force of the pair of actuating members 75, 75, the engaging arm means 61 is forced to carry out the disengaging operation for releasing the used pallet P therefrom against the urging force of the compression spring 66 (see FIG. 13B).

Figure 13A:
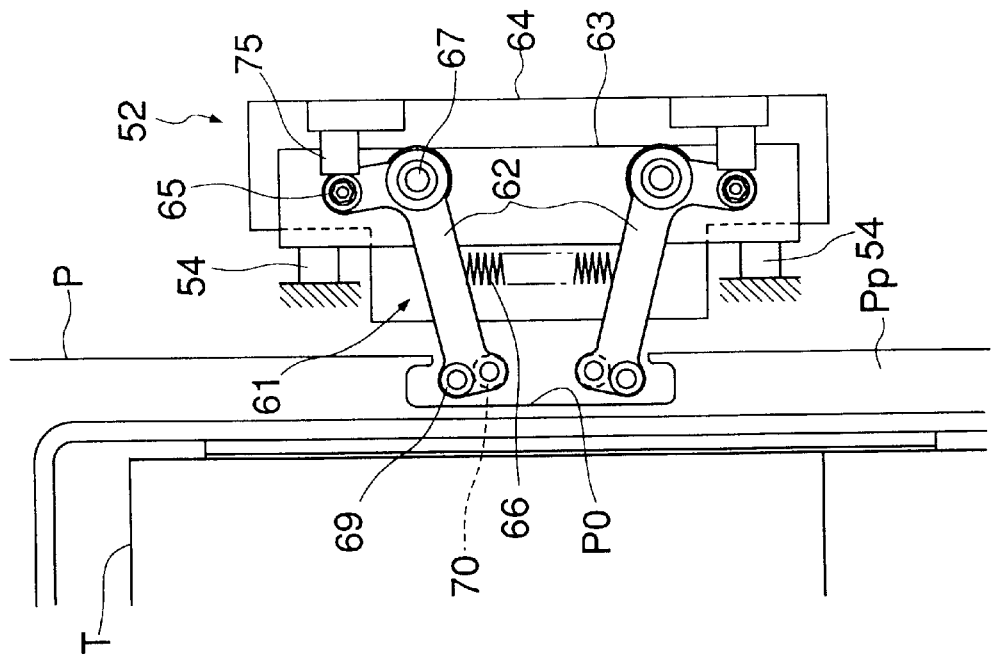
FIGS. 13A and 13B are diagrams which are useful in explaining operations for engagement with and disengagement from a pallet, which are executed by engaging arm means.
Figure 13B:
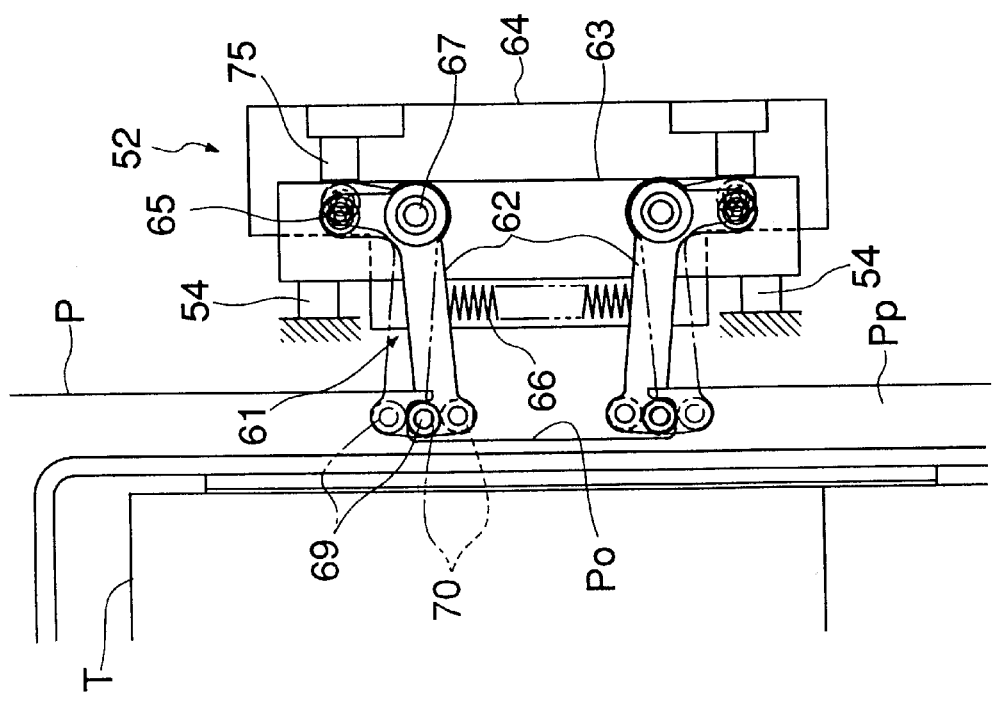

At this time, the elevating mechanism is driven to bring a new pallet P to the engaging arm means 61, and the main unit 64 which has overrun the stoppers 54, 54 starts to move backward, whereby according to the reversed procedure, the actuating members 75, 75 are withdrawn and the engaging arm means 61 is caused to execute the engaging operation by the urging force of the compression spring 66 (see FIG. 13A). When the engaging arm means 61 engages with the new pallet P, stopper portions of the main unit 64 almost simultaneously abuts against the sliding block 71 of the arm support block 63, whereby the arm support block 63 is moved backward together with the main unit 64. In this manner, the engaging arm means 61 engages with and disengages from each pallet P for replacement of pallets P.

As described above, the engaging/disengaging operations of the engaging arm means 61 can be carried out by using the drive mechanism 53 as a drive source therefor. That is, dedicated driving means for causing the engaging arm means 61 to execute its engaging/disengaging operations can be dispensed with, which makes it possible to simplify the construction of the electronic component-mounting apparatus as well as reduce manufacturing costs thereof.

Figure 14:
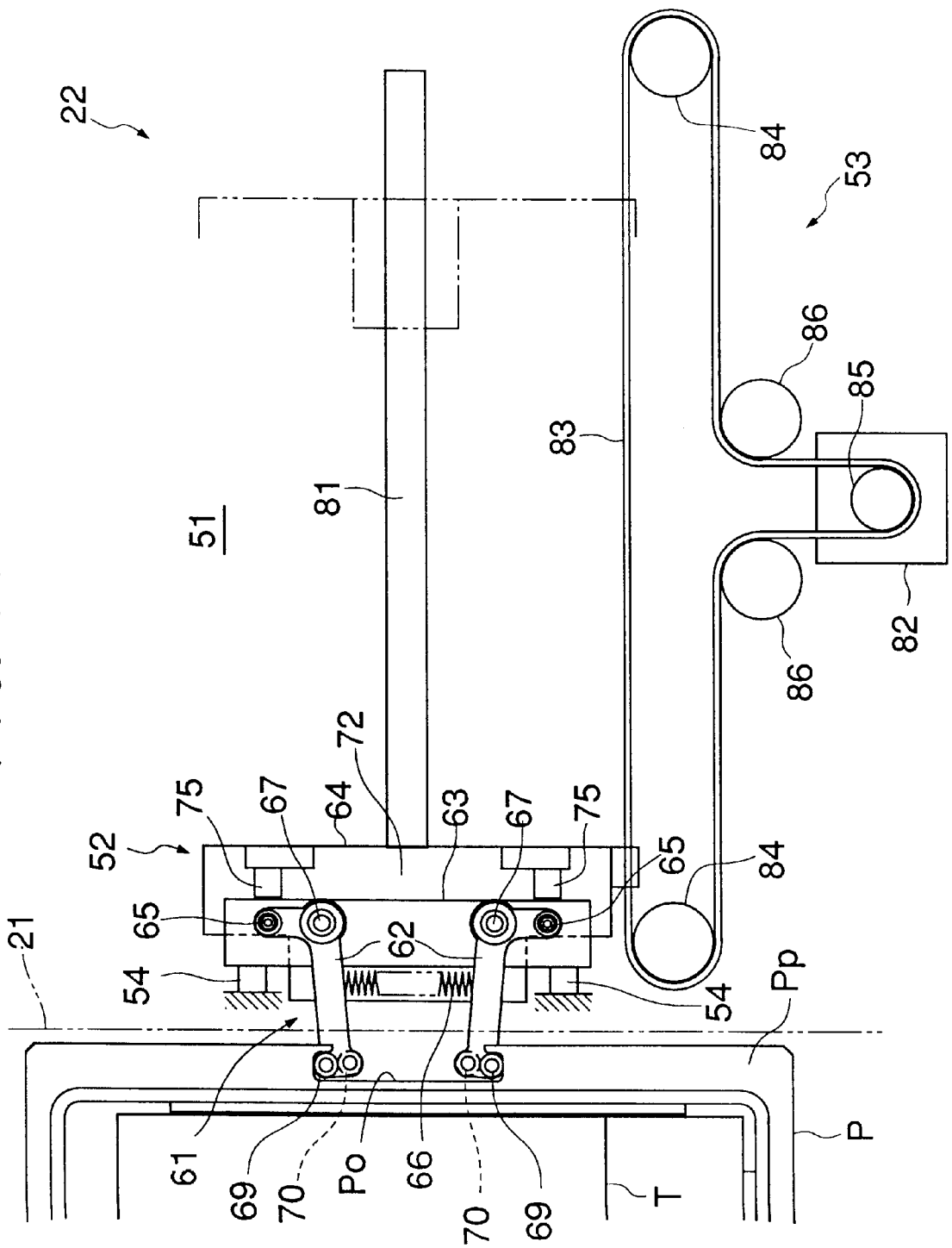
FIG. 14 is a plan view of the pallet guide device.

Next, the drive mechanism 53 is described with reference to FIG. 14. As shown in the figure, the drive mechanism 53 is comprised of the center rail 81 supporting the engaging arm unit 52 such that it is movable forward and backward in the direction of moving pallets P, a drive motor 82 moving the engaging arm unit 52 forward and backward along the center rail 81, and a timing belt 83 transmitting torque from the drive motor 82 to the engaging arm unit 52. The timing belt 83 is stretched between a pair of driven pulleys 84, 84 arranged in a manner spaced from each other in the direction of moving pallets P, a driving pulley 85 fitted on a main shaft of the drive motor 82, and a pair of intermediate pulleys 86, 86 arranged between one of the pair of driven pulleys 84, 84 and the driving pulley 85 and between the other of the driven pulleys 84 and the driving pulley 85. Further, to the timing belt 83 is fixed a side portion of the main unit 64 of the engaging arm unit 52, so that the timing belt 83 is caused to run in a normal or reverse direction, whereby the engaging arm unit 52 is moved forward or backward.

The drive motor 82 is formed of a stepping motor so as to be controlled by the above controller 23. The controller 23 controls the drive motor 82 to move the engaging arm unit 52 forward and backward at a constant speed. However, when the main unit 64 is overrunning the stoppers 54, 54, the controller 23 decelerates the engaging arm unit 52. The engaging operation position of the engaging arm means 61 and a position where the main unit 64 eventually stops after overrunning the stoppers 54, 54 are detected by a sensor or a switch, not shown, and in response to a signal indicative of the sensed position, the controller 23 reduces the rotational speed of the drive motor 82. This causes the engaging arm means 61 to very slowly carry out its engaging/disengaging operations. Furthermore, the rotational speed of the drive motor 82 may be reduced stepwise or by progressively increasing decrements, or alternatively only when the engaging operation is effected.

The above control of the drive motor 82 carried out by the controller 23 makes it possible to minimize a shock caused by the arm portions 62, 62 abutting against an arm-holding portion Po of a pallet P in the course of the engaging operation, which eliminates the inconvenience that electronic components loaded on the pallet P jump out of component-holding grooves in a tray T. Further, the arm portions 62, 62 per se abut against the pallet P from respective horizontal directions, which also makes it possible to inhibit electronic components from jumping out of component-holding grooves in the tray T. Furthermore, the engaging force of the arm portions 62, 62 acts in opposite directions to cancel each other, which prevents the pallet P from being moved by the arm portions 62, 62. This also makes it possible to inhibit electronic components from jumping out of the component-holding grooves in the tray T.

It should be noted that inversely to the above embodiment, it is possible to cause the engaging arm to perform an arm-closing operation for engagement with a pallet, and cause the same to perform an arm-opening operation for disengagement from the pallet. In such a case, an arm-holding potion of a pallet is comprised a convex portion formed in the center of a level front edge of the pallet P by cutting two portions of the level front edge of the pallet P into C-shaped cutouts.

As described above, according to the electronic component-mounting apparatus of the first embodiment, each pallet can be guided to a desired position in a pickup area where electronic components are to be picked up, which makes it possible to minimize a waiting time period during which each mounting head has to wait before it starts its operation, to thereby reduce the tact time.

Further, according to the electronic component-mounting apparatus of the embodiments other than the first embodiment, pallets can be replaced in a reduced time period, which makes it possible to minimize the waiting time period of each mounting head to thereby reduce the tact time.

Moreover, according to the component-feeding device of the invention, engaging arm means can be engaged with and disengaged from a pallet by driving means for moving the engaging arm forward and backward, whereby it is possible to omit a drive source dedicatedly used for the engagement and disengagement between the engaging arm and the pallet, which makes it possible to simplify the construction of the electronic component-mounting apparatus and its control system as well as reduce manufacturing costs thereof.

It is further understood by those skilled in the art that the foregoing are preferred embodiments of the invention, and that various changes and modification may be made without departing from the spirit and scope thereof.

What is claimed is:

1. A component-feeding device for an electronic-mounting apparatus, comprising:
    a pallet-storing block for storing a plurality of pallets each carrying thereon a tray containing a plurality of electronic components;
    transfer means for moving a desired pallet selected from said plurality of pallets along a transfer path to advance said desired pallet from said pallet storing block to a pickup position or withdraw said desired pallet from said pickup position toward said pallet-storing block, said transfer means including an engagement unit comprising engaging arms to effect engagement with and disengagement from said desired pallet while in said pallet storing block;
    driving means for moving said engagement unit along said transfer path to advance said engagement unit to said desired pallet or withdraw from said desired pallet while in said pallet storing block; and
    conversion means for converting a driving force applied to said engagement unit by said driving means for moving said desired pallet out of and into said pallet storing block by urging said engaging arms of said engagement unit into respective operations for engagement with and disengagement from said desired pallet.

2. A component-feeding device according to claim 1, wherein said conversion means comprises:
    an arm support block for supporting said engaging arms so that said engaging arms are capable of engaging with and disengaging from each of said pallets;
    a body supporting said arm support block so that said arm support block is capable of moving along said transfer path relative to said body, said body being moved by said driving means in unison with said arm support block;
    a stopper for stopping said arm support block from advancing when said arm support block has moved in unison with said body to an engaging operation position;
    an actuating member fixed to said body, said actuating member causing said engaging arms to carry out an operation for said engagement as said body is further advanced with respect to said arm support block and carry out an operation for said disengagement as said body is withdrawn, in a state in which said arm support block is in stoppage.

3. A component-feeding device according to claim 1, wherein said engaging arms are arranged in a pair at respective locations opposed to each other in a direction transverse to said transfer path.

4. A component-feeding device according to claim 3, wherein said engaging arms each comprise an engaging block for engagement with said each of said pallets, an abutment portion against which said actuating member abuts to apply said driving force of said driving means thereto, and a connecting portion integrally formed with said engaging block and said abutment portion, said arm support block including a pivot for pivotally supporting said connecting portion, and urging means for urging said engagement block in an engaging direction.

5. A component-feeding device according to claim 4, wherein said urging means comprises a spring interposed between said engaging arms in a pair.

6. A component-feeding device according to claim 3, wherein said transfer means includes guide means for supporting said desired pallet in a manner such that said desired pallet is movable along said transfer path.

7. A component-feeding device according to claim 6, wherein said guide means includes a plurality of guide blocks located at different levels, said engaging block comprises a plurality of engaging portions each formed at levels identical to said different levels of said guide blocks, respectively.

* * * * *